United States Patent [19]

Sollman

[11] Patent Number: 4,630,224

[45] Date of Patent: Dec. 16, 1986

[54] AUTOMATION INITIALIZATION OF RECONFIGURABLE ON-LINE AUTOMATIC TEST SYSTEM

[75] Inventor: Larry C. Sollman, Bloomington, Ind.

[73] Assignee: The United States of America as Represented by the Secretary of the Navy, Washington, D.C.

[21] Appl. No.: 601,872

[22] Filed: Apr. 19, 1984

[51] Int. Cl.$^4$ .................. G01R 15/12; G06F 11/00
[52] U.S. Cl. ..................... 364/550; 324/73 AT; 364/481; 364/579; 371/20
[58] Field of Search ............ 364/200, 900, 480, 481, 364/483, 550, 579; 324/73 AT; 371/20

[56] References Cited

U.S. PATENT DOCUMENTS

| | | | |
|---|---|---|---|
| 3,237,100 | 2/1966 | Chalfin et al. | 324/73 |
| 3,706,974 | 12/1972 | Patrick et al. | 340/172.5 |
| 3,764,995 | 10/1973 | Relf et al. | 340/172.5 |
| 3,892,955 | 7/1975 | Maejima | 235/153 |
| 3,931,506 | 1/1976 | Borelli et al. | 235/153 |
| 4,168,796 | 9/1979 | Fulks et al. | 235/302 |
| 4,300,207 | 11/1981 | Eivers et al. | 364/900 |
| 4,354,268 | 10/1982 | Michel et al. | 371/20 |
| 4,397,021 | 8/1983 | Lloyd et al. | 371/20 |
| 4,402,055 | 8/1983 | Lloyd et al. | 371/20 X |
| 4,488,299 | 12/1984 | Fellhauer et al. | 371/20 |
| 4,550,406 | 10/1985 | Neal | 371/20 |

Primary Examiner—Felix D. Gruber
Assistant Examiner—Kevin J. Teska
Attorney, Agent, or Firm—Harvey A. David; Robert F. Beers

[57] ABSTRACT

A reconfigurable, automatic test equipment system having a controller connected by a system bus to a plurality of IEEE-488 based instrument resource stations is characterized by automatic initialization capability including automatic address searching. Automatically initializable resource stations each include an initializing circuit cooperable with the controller and respective resource to zero in on successive characters of a unique identifier for each resource.

3 Claims, 2 Drawing Figures

AUTOMATION INITIALIZATION OF RECONFIGURABLE ON-LINE AUTOMATIC TEST SYSTEM

BACKGROUND OF THE INVENTION

This invention relates to the field of automatic test equipment (ATE), and more particularly to the automatic integration of one or more of a variety of ATE instrument resources, notably IEEE-488 based devices such as computers, counters, power supplies, meters, printers, etc., into a system which is thereby tailored for a particular test procedure or series of procedures.

Traditionally, the large tightly integrated automatic test system has been used to increase the productivity of high-volume/low-variety testing-dominant operations and was built by a system integrator who combined various IEEE-488 resources via software and hardware to satisfy a particular user. Such a system usually had a markup of two to eight times the cost of the resources and was difficult to alter in response to changing user needs such as replacement of obsolete resources and test requirement updates.

Heretofore, it has been the practice for the user of an IEEE-488 based test system of the type having a controller that communicates via an IEEE-488 bus with individual test resources or instruments to manually set address switches in the controller to initilize the system. This presupposes that the address of each resource is known, and requires considerable down-time of the system to effect a new test configuration. U.S. Pat. No. 3,764,995 shows a programmable test system wherein automatic switching is accomplished by a relay matrix to configure a system having predetermined resources of known addresses as preexisting components of the system. While that approach allows some flexibility it is limited to the resources and configurations previously established by the relay matrix.

Attempts to apply ATE system technology to repair operations, for example of specialized avionics systems, have met with only limited success because the workload is typically low-volume/high-variety in nature and human intervention is dominant. The resulting set-up/tear-down penalties and human intervention aspects of the testing have rendered the test systems idle for inordinate periods of time. Accordingly, it would be desirable to have an automatically reconfigurable, on-line ATE system that includes an IEEE-488 based information distribution system that will make assembly and reassembly automatic test systems as easy and inexpensive as manual test systems are now, with all the advantages previously reserved to application to high volume production testing situations.

SUMMARY OF THE INVENTION

With the foregoing in mind, it is a first important object of this invention to provide a method and apparatus for use in an automated test system whereby the system is operative to effect automatic initialization, that is to say, automatic conditioning of the controller of the system to communicate via IEEE-488 bus with each of a plurality of IEEE-488 compatible instruments, or resources, in such a manner as to be able to carry out a desired series of test functions or resultant operations.

As another important object the invention aims to provide an automatically reconfigurable test system having a plurality of automatically initializeable resource stations, each comprising an IEEE-488 based instrument or resource connected by means of an initialization circuit to the IEEE-488 test system bus.

Yet another object of the invention is the provision of a system of the foregoing character that is compatible with other IEEE-488 instruments as non-automatically initialization resource stations.

Still another object is the provision, in an automatic test system, and as part of the initialization of the system of a method and apparatus for automatically assigning addresses to IEEE-488 resources, whereby the controller is placed in communication therewith for effecting the automatic initialization and subsequent test procedures.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
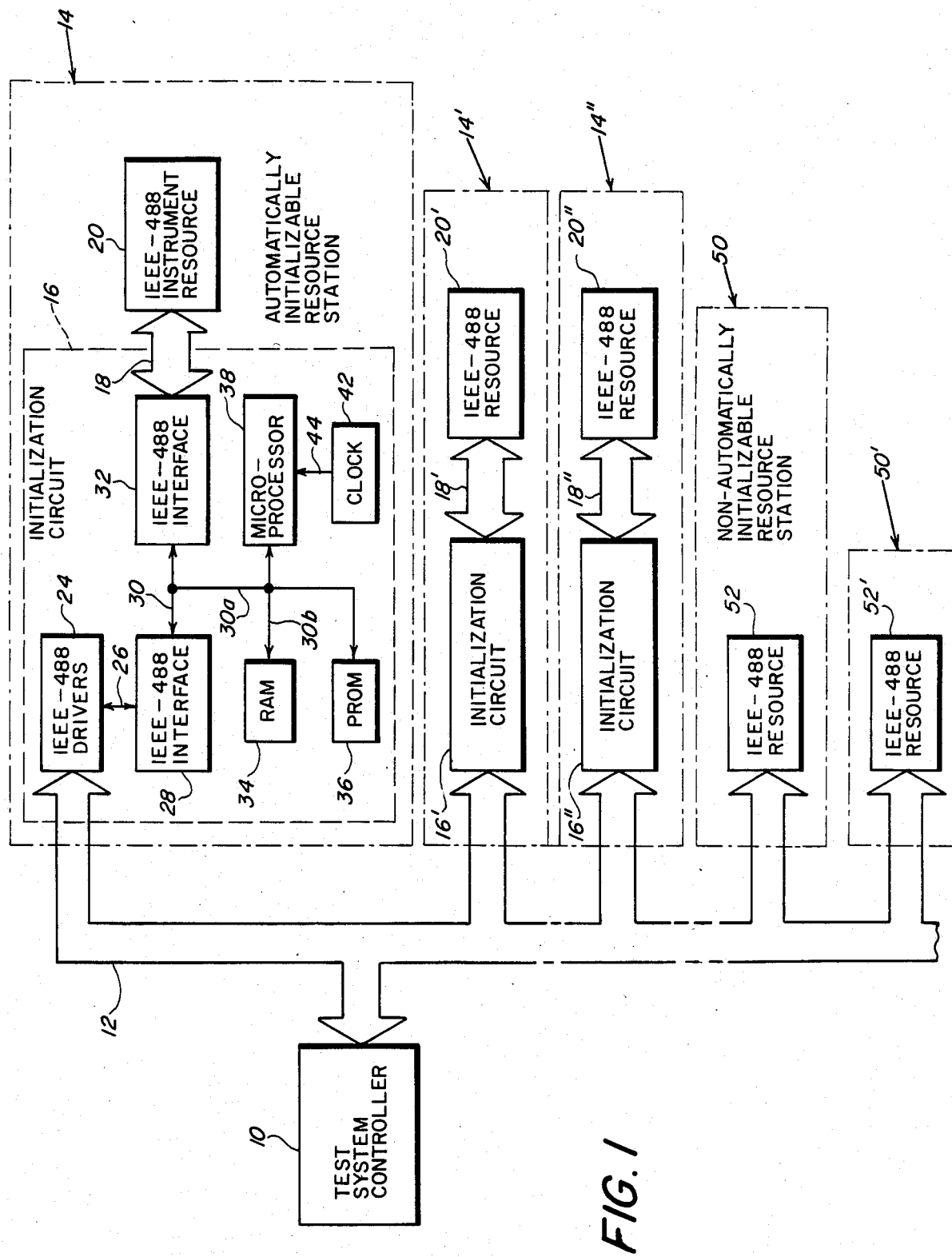
FIG. 1 is a block diagram illustrating automatic initialization apparatus according to the invention in a reconfigurable on-line ATE information distribution portion of a test system.

Referring now to the exemplary embodiment illustrated in the FIG. 1, 10 is a test system controller, conveniently a Hewlett Packard Corporation model HP 9825. Controller 10 communicates via an IEEE-488 test system bus 12 with a plurality of automatically initializeable resource stations generally indicated at 14, 14', 14". Station 14 comprises an initialization circuit 16, an IEEE-488 instrument bus 18, and an IEEE-488 instrument or resource 20, such as a voltmeter, power supply, or the like. Similarly, the resource stations 14' and 14" comprise initialization circuits 16', 16", buses 18', 18", and IEEE-488 resources 20', 20".

The initialization circuits 16, 16', and 16" are identical, and the description of circuit 16 is applicable to each. The circuit 16 comprises an IEEE-488 driver 24, conveniently of type SN 75160/SN 75161, as appropriate, available from Texas Instruments and which provides the necessary electrical interface with the bus 12. The driver 24 is connected as shown by flow line 26 to drive an interface chip 28, conviently a Texas Instruments type TMS 9914A. This is a conventional IEEE-488 interface device that possesses the protocols such as hand-shaking, processing universal commands, and the like necessary to operate effectively on the bus 12 via the driver 24. The interface 28 is coupled as shown via flow line 30, an identical interface chip 32, and resource bus 18 to the IEEE-488 resource 20. The interface chips 28, 32 are further connected, as shown by flow lines 30a and 30b for data flow to and from a random access memory (RAM) 34, a programmable read only memory (PROM) 36, and a microprocessor 38. RAM 34 is conveniently a type 2114 of National Semiconductors, Inc. and serves to store temporary data such as the address of the associated resource 20, a controller assigned address, and pointers, etc. needed by microprocessor 38. PROM 36 is a 32K type 2732 of INTEL, Inc. and contains commands used by the microprocessor 38 to participate in the initialization procedure, while the microprocessor 38 is conveniently a mode Z80 of Zilog Corporation that executes the commands contained in PROM 36, processes data acquired from, and controls the operation of, the other components of the initialization circuit. The microprocessor 38 is responsive to a clock 42 that provides clock signals via line 44 and is conveniently a Motorola MC 6875.

It will be understood that more or fewer automatically initializable resource stations like 14, 14', etc. can be coupled to the system bus 12, and that, thorugh the controller 10, one can automatically configure a test system that will perform predetermined test functions within the capabilities of the on-line resource stations 14, 14', 14'', etc.

In addition, the system illustrated in the Figure is compatible with, and is shown as comprising, a plurality of non-automatically initializable test resource stations 50, 50'. These stations comprise an IEEE-488 based test instrument or resource such as 42, 42' directly coupled to the IEEE-488 test system bus 12, without an initialization circuit such as 16. While these stations are not automatically initilizable in the sense as those having initialization circuits 16, 16', 16'', etc., the test system of this invention can accommodate such existing resources not having automatic initialization capability, all as will become apparent.

MODE OF OPERATION

In order to more readily understand the operation of the above described system, the following definitions and conditions are given:

a. Acronyms.
  ATN=Attention Line
  NRFD=Not Request for Data
  NDAC=Not Data Accepted
  SRQ=Service Request Line
  DI01-DI08=Eight Data Lines on the bus
  ROLAIDS=Reconfigurable On-Line ATE Information Distribution System
  FSCM=Federal Supply Code for Manufacturers
  ASCII=American Standard Code for Information Interchange b. Two command codes are reserved for enabling a special ROLAIDS mode: Universal Command=18B, Addressed Command-02B. ("# . . . B" is the decimal equivalent of an eight-bit binary word.) Initialization can only be invoked by the universal command.

c. Address 15 ("/" character) is reserved for the communications link during the execution of a special mode and thus is not available for assignment to an instrument.

d. Each test resource 20, 20', 20'' of the respective stations 40, 40', 40'' and 52, 52' of stations 50, 50', has a unique identifier comprises of two sub-identifiers. This first sub-identifier is the combination of the FSCM and model numbers. The first five character locations of this sub-identifier is reserved for the FSCM number. The second sub-identifier is the serial number. Each sub-identifier is stored internally in a resource station terminated with the line feed character (10B).

e. The FSCM, model and serial number characters must be printable (32B to 126B).

f. DI08 Line-TRUE (OV) is a command to each test resource station to determine its future listening status; otherwise DI08=FALSE (5 V).

The bus orientation of the IEEE-488 interfaces requires that a unique address be assigned to each test resource station 40, 40', 40'' etc. The controller 10 does this by setting all test resources to the listen mode and itself to the talk mode. It causes all resource stations except one to eventually cease listening at which time it assigns a unique address to the listening resource station and that resource station ceases to participate in the initialization. The controller resumes this selection procedure and unique address assignment until all the test resource stations have been processed. During the selection procedure, the controller 10 searches for unique FCSM-model/serial-number combinations stored at the resource station. The combination it finds is the one with the first character in the FCSM, model or serial number that is the lowest-valued one being compared to the current controller character. An example using a model number is 8000 for the two combinations of 8000 and 8502 because the character 0 is the lowest character found first. However, for the same FSCM number, it does select the longest model number. Example: 845A is selected before 845.

Figure 2:
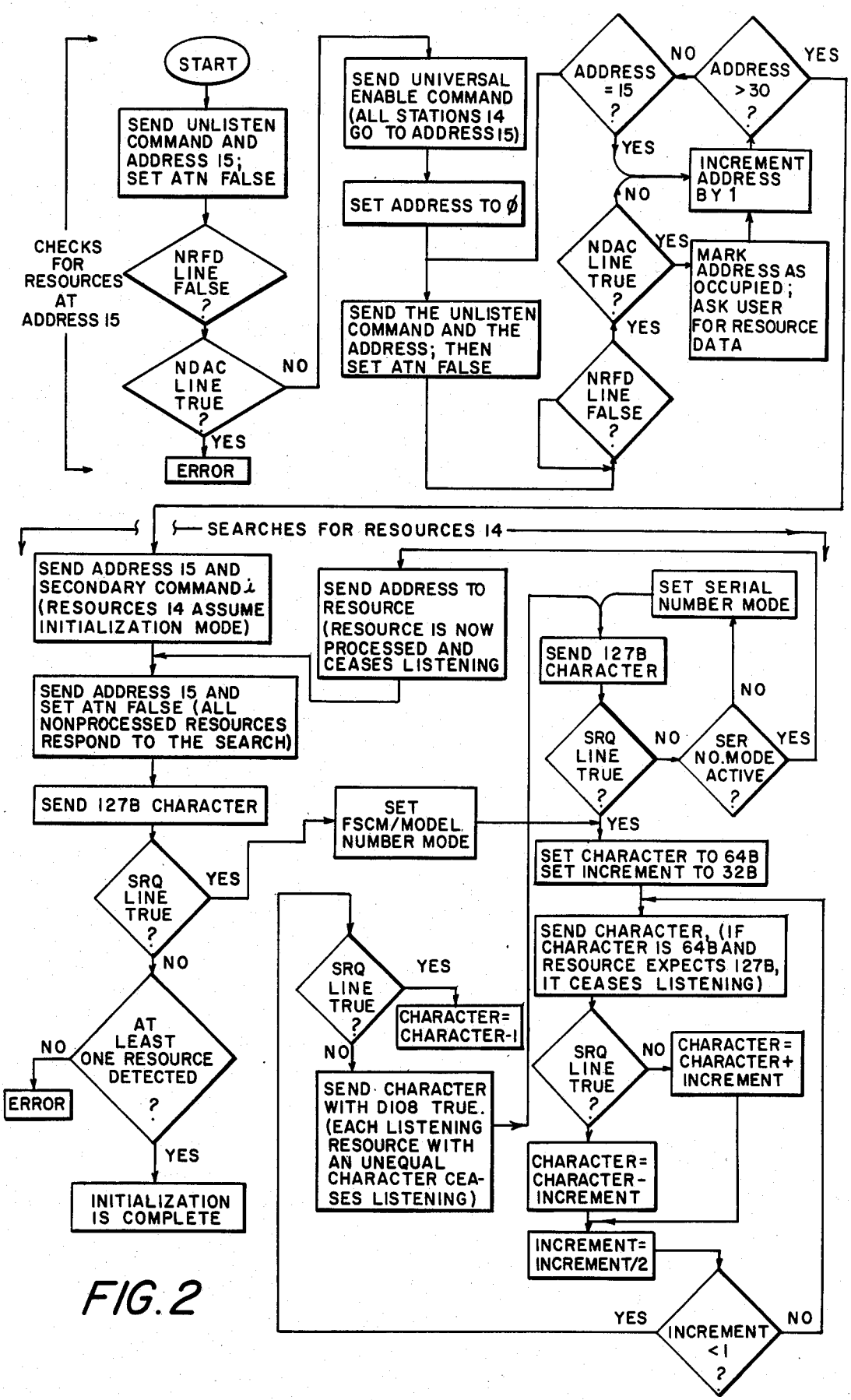
FIG. 2 is a flowchart illustrating the method of operation of the apparatus of FIG. 1.

Specifically, and with reference to the flowchart of FIG. 2, the initialization procedure operates as follows. The controller 10 checks for any instruments or resources 20, 20', 20'', etc. at address 15. If this address is found to be occupied, an error will be generated. It then sends the universal enable command (18B with ATN TRUE) which causes each resource station to set its listen address to 15, and it searches for non-automatically initializable test resources or instruments across the entire address space, excluding address 15. At each address (as was done for address 15 previously), the unlisten command (?) and the address are sent to the bus with the ATN line asserted TRUE. After the address is removed from the data lines, the ATN line is asserted FALSE and the NRFD line is sensed for the FALSE state. When this state is detected, the NDAC line is monitored for a TRUE state. If it is TRUE, the controller marks the address as occupied and requires the user to supply the FSCM, model and serial numbers. (This same procedure is used by the initialization circuit 16, 16', 16'' of automatically initializable stations 40, 40', 40'' to find the address of its associated instrument 20, 20', 20'' except that the universal command of 18B is not sent, and address 15 is not excluded from the search.) Next, the controller initiates the automatically initializable resource station selection procedure by sending address 15 and the secondary command for initialization, 105B ("i") with ATN TRUE. Each of these resource stations responds by maintaining its listen address at 15 and points to the first character of its FSCM model number which will be compared with controller characters. The controller begins a resource search by sending address 15 to cause all non-processed resources to listen, sets ATN FALSE and then successively searches for each character in a FSCM-model/serial number combination. When the controller outputs a character, each resource pointing to a character that is smaller than the controller character asserts the SRQ line of the bus TRUE. All other resources release the SRQ line. For example, a resource pointing to an ASCII "A" will assert the SRQ line TRUE if the controller is outputting an "B".

The controller 10 starts each character search with the transmission of a 127B character. Since only printable characters (32B through 126B) are allowed in the FSCM, model and serial numbers, any listening resource will assert the SRQ line TRUE. If, following the last 127B character, SRQ is not asserted TRUE, no instruments are on the bus which is an error condition.

Otherwise, the controller 10 begins a successive-approximation search by sending a 64B. In accordance with present invention, the search technique zeros in on the lowest character by subtracting an increment from this number if the SRQ line is TRUE or adding it if the line is FALSE. The increment starts at 32B and is divided by two with each new character outputted until the increment value of 1B is reached. At this point, the controller will be at the lowest resource character if the SRQ line is FALSE or one above if it is TRUE. If the SRQ line is FALSE, the same character is sent out again with DI08 TRUE. If the SRO line is TRUE, the next lower character is sent with DI08 TRUE. The DI08 TRUE condition indicates to the resources that they are to determine their listening status. A resource remains listening if its character equals the current controller character (excluding the DI08 state); otherwise, it ceases to listen and waits for address 15 to be sent again. The resource(s) still listening await the initiation of the next character search.

The above sequence continued until 127B is sent by the controller and no resource asserts the SRQ line TRUE. The controller interprets this condition as the end of the FSCM/model number sub-identifier and sends a 127B character again to initiate the search for the first serial number character. Detection of the model number end is necessary to prevent the possibility of two resources being assigned the same address. For example, one resource may have a model-number/-serial-number combination (identical FSCM numbers) of 845A/123 whereas another may have 845/A123. Although the model and serial numbers are different, the total combinations are not, and thus the end of the model number must be made known to cause one of the resources (one with the smaller model number) to cease listening. That resource (model number 845) expects two 127B characters to be sent after the "5" is processed. (The first 127B character finds the end of the model number—no SRQ TRUE assertion. The second 127B initiates the search of the first serial number character.) However, the "A" of the 845A resource causes the SRQ line to be asserted TRUE when 127B is sent. The controller assumes that another character is to be searched in the model number and sends only characters from 32B through 126B. Since the second 127B character did not occur, the 845 resource ceases listening. Once the end-of-model number condition is processed, the serial number characters are searched in the same way as those of the model number. When the 127B character does not cause an SRQ TRUE assertion again, the controller assumes that the end of a serial number has been reached and that the associated resource has been selected. The controller assigns this first selected resource the first unoccupied address. (In reality, the controller can assign any unoccupied address, except 15 ("/")). However, it is recommended that addresses be assigned sequentially starting from the lowest unassigned one.

The controller continues the next resource search by sending address 15 followed by 127B. Resources already processed no longer have an address of 15 and thus do not respond. However, all the remaining ones do and are selected one by one for which each is assigned an available address up to and including 30 (excluding 15). Eventually, all resources are processed and therefore the SRQ line is not asserted TRUE when the 127B character is sent after the address 15 character. This condition indicates the completion of the initialization process.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

What is claimed is:

1. A reconfigurable, automatically initializable test system comprising:
   test system controller means for transmitting and receiving data signals;
   a test system bus connected to said controller means for conveying said data signals;
   a plurality of automatic initialization resource stations connected to said test system bus, each of said stations comprising a test resource having a unique identifier, an initialization circuit connected to said test system bus, and an instrument bus for connecting said resource to said initialization circuit;
   said initialization circuit comprising interface means, memory means coupled by said interface means to said system bus interface means, for storing said unique identifier of the associated resource, and microprocessor means connected to said memory means and responsive to said data signals for providing said identifier to said controller means;
   said controller means being responsive to said identifier to assign a predetermined address to each said resource station for retention in said memory means, whereby said resource stations and said controller means are thereafter cooperative to effect a predetermined test program; and
   said controller means and said initialization circuits being cooperable to perform character by character address searching by a successive-approximation routine that progressively eliminates resources from a listening mode as individual identifier characters are determined until the entire unique identifier of a given resource is obtained, the searching being repeated for each of the automatic initialization resources of the system.

2. A reconfigurable test system as defined in claim 1, and wherein said controller means, said resources, and said bus means are IEEE-488 based components.

3. A method of address localization in a reconfigurable test system including a controller, a test system bus, and a plurality of resource stations each having a unique multiple character identifier, said method comprising the steps of:
   a. causing said controller to transmit a listen command so that each resource station of the system is placed in a listen mode;
   b. causing said controller to transmit a comparison character to each resource station;
   c. causing each resource station that has a first identifier character that differs from said comparison character by more than a predetermined increment to cease its listen mode;
   d. successively changing said comparison character by increments added to or subtracted from the comparison character so as to match the lowest first identifier character common to the resource stations still in said listening mode;
   e. repeating steps (b) through (d) for the second and subsequent identifier characters until only a single resource station remains listening;
   f. assigning a specific address to that single resource station;
   g. repeating steps (a) through (f) for the remaining resource stations until all the stations have had addresses assigned.

* * * * *